(12) United States Patent
Cheng et al.

(10) Patent No.: US 11,911,996 B2
(45) Date of Patent: Feb. 27, 2024

(54) TUNABLE BLINDS FOR WINDOWS

(71) Applicants: President and Fellows of Harvard College, Cambridge, MA (US); Cardinal CG Company, Eden Prairie, MN (US)

(72) Inventors: Kezi Cheng, Cambridge, MA (US); Aftab Hussain, Cambridge, MA (US); Keith Burrows, Mineral Point, WI (US); David Clarke, Cambridge, MA (US)

(73) Assignees: President and Fellows of Harvard College, Cambridge, MA (US); Cardinal CG Company, Eden Prairie, MN (US)

( * ) Notice: Subject to any disclaimer, the term of this patent is extended or adjusted under 35 U.S.C. 154(b) by 861 days.

(21) Appl. No.: 16/965,531

(22) PCT Filed: Jan. 29, 2019

(86) PCT No.: PCT/US2019/015567
§ 371 (c)(1),
(2) Date: Jul. 28, 2020

(87) PCT Pub. No.: WO2019/148165
PCT Pub. Date: Aug. 1, 2019

(65) Prior Publication Data
US 2021/0047882 A1     Feb. 18, 2021

Related U.S. Application Data

(60) Provisional application No. 62/623,241, filed on Jan. 29, 2018.

(51) Int. Cl.
*B32B 17/10*     (2006.01)
*B32B 17/06*     (2006.01)
(Continued)

(52) U.S. Cl.
CPC ............ *B32B 17/10* (2013.01); *B32B 17/063* (2013.01); *B32B 25/08* (2013.01); *B32B 25/10* (2013.01);
(Continued)

(58) Field of Classification Search
CPC ....... B32B 17/10; B32B 17/063; B32B 25/08; B32B 25/10; B32B 2307/412; E06B 9/24;
(Continued)

(56) References Cited

U.S. PATENT DOCUMENTS

2008/0245975 A1*  10/2008  Miller ................. G03F 7/70291
                                                                    355/43
2013/0278542 A1    10/2013  Stephanou et al.
(Continued)

FOREIGN PATENT DOCUMENTS

WO     WO 2017/048754 A1     3/2017

OTHER PUBLICATIONS

PCT/US2019/015567, Apr. 25, 2019, International Search Report and Written Opinion.
(Continued)

*Primary Examiner* — Robert E. Tallman
(74) *Attorney, Agent, or Firm* — Wolf, Greenfield & Sacks, P.C.

(57)     ABSTRACT

Methods and apparatus for modulating light using a tunable light modulation device. The tunable light modulation devices comprises an elastomer structure including at least one elastomer layer, a compliant electrode network of conducting fibers arranged on a first surface of the at least one elastomer layer, a patterned electric conductor arranged on a second surface of the at least one elastomer layer opposite the first surface. The patterned electric conductor includes a plurality of individually-addressable sections, and the compliant electrode network is configured to compress the at
(Continued)

least one elastomer layer in the presence of an electric field between the compliant electrode network and one or more of the individually-addressable sections of the patterned electric conductor to produce a voltage-dependent roughening of the at least one elastomer layer.

18 Claims, 8 Drawing Sheets

(51) Int. Cl.
G02F 1/17 (2019.01)
B32B 25/08 (2006.01)
B32B 25/10 (2006.01)
E06B 9/24 (2006.01)

(52) U.S. Cl.
CPC ............... E06B 9/24 (2013.01); G02F 1/17 (2013.01); B32B 2307/412 (2013.01); E06B 2009/2405 (2013.01); E06B 2009/2417 (2013.01); E06B 2009/2464 (2013.01); E06B 2009/2482 (2013.01); G02F 2201/12 (2013.01); G02F 2202/36 (2013.01); G02F 2203/48 (2013.01)

(58) Field of Classification Search
CPC ..... E06B 2009/2405; E06B 2009/2417; E06B 2009/2464; E06B 2009/2482; G02F 1/17; G02F 2201/12; G02F 2202/36; G02F 2203/48; G02F 1/0063; G02F 2201/44; G02F 2201/54; H10N 30/206; H10N 30/857; G02B 5/0278; G02B 26/023
See application file for complete search history.

(56) References Cited

U.S. PATENT DOCUMENTS

| 2014/0185004 | A1 | 7/2014 | Reichow et al. |
| 2016/0085130 | A1 | 3/2016 | Timofejevs et al. |
| 2016/0259225 | A1 | 9/2016 | Paolini, Jr. et al. |
| 2018/0246318 | A1* | 8/2018 | Shian .................... G02B 26/06 |

OTHER PUBLICATIONS

PCT/US2019/015567, Aug. 13, 2020, International Preliminary Report on Patentability.
International Search Report and Written Opinion in connection with International Application No. PCT/US2019/015567, dated Apr. 25, 2019.
International Preliminary Report on Patentability in connection with International Application No. PCT/US2019/015567, dated Aug. 13, 2020.
Cheng et al., Spatially and temporally tunable window devices on flexible substrates. Proc. SPIE. Electroactive Polymer Actuators and Devices (EAPAD) XX. Mar. 27, 2018. vol. 10594. 9 pages. doi:10.1117/12.2296449.

* cited by examiner

TUNABLE BLINDS FOR WINDOWS

RELATED APPLICATIONS

The application is a national stage filing under 35 U.S.C. § 371 of international application number PCT/US2019/015567, filed Jan. 29, 2019, entitled "TUNABLE BLINDS FOR WINDOWS," which claims benefit under 35 U.S.C. § 119(e) to U.S. Provisional Application Ser. No. 62/623,241, filed Jan. 29, 2018, entitled "TUNABLE BLINDS FOR WINDOWS," the entire contents of each of which are incorporated herein by reference.

FEDERALLY SPONSORED RESEARCH

This invention was made with government support under Grant No. 1333835 awared by National Science Foundation. The government has certain rights in the invention.

BACKGROUND

In many homes and offices, window blinds are often installed to alter the amount of light passing through the window or to provide a measure of privacy. A variety of different blind designs exist, with two of the most common being pleated blinds or shades where a cloth or plastic shade is raised or lowered with respect to the window frame, examples of which are shown in FIG. 1. Some designs allow both the top and bottom of the blind to be varied. Irrespective of the particular design, window blinds allow a proportion of the window to be obscured or shaded.

SUMMARY

According to one aspect of the technology described herein, a tunable light modulation device is provided. The tunable light modulation device comprises an elastomer structure including at least one dielectric layer, a compliant electrode network of conducting fibers arranged on a first surface of the at least one dielectric layer, and a patterned electrical conductor arranged on a second surface of the at least one dielectric layer opposite the first surface, wherein the patterned electrical conductor includes a plurality of individually-addressable sections, and wherein the compliant electrode network is configured to compress the first surface of the at least one dielectric layer in the presence of an electric field between the compliant electrode network and one or more of the individually-addressable sections of the patterned electrical conductor to produce a voltage-dependent roughening of the first surface of the at least one elastomer layer.

According to another aspect, the plurality of individually-addressable sections are separated by gaps to prevent electrical shorting between the sections. For example, the gaps may be at least 2 μm.

According to another aspect, the tunable light modulation device further comprises a transparent substrate arranged adjacent to the patterned electrical conductor.

According to another aspect, the transparent substrate comprises glass or transparent plastic.

According to another aspect, the transparent substrate is curved.

According to another aspect, the transparent substrate is flexible.

According to another aspect, the tunable light modulation device further comprises a controller configured to selectively provide a voltage to one or more of the plurality of individually-addressable sections.

According to another aspect, the controller is configured to selectively provide a voltage to the plurality of individually-addressable sections in sequence to provide a dynamic translucence effect.

According to another aspect, the individually-addressable sections are arranged as a series of conductive strips separated by gaps, and the dynamic dimming effect mimics the opening or closing of horizontal or vertical blinds.

According to another aspect, the controller is configured to wirelessly receive control signals from a mobile electronic device.

According to another aspect, the light modulation device further comprises a plurality of conductive interconnects, each of which is arranged to couple one of the plurality of individually-addressable sections to a voltage source.

According to another aspect, the compliant electrode network comprises a plurality of nanowires or a plurality of carbon nanotubes.

According to another aspect, the compliant electrode network is configured to be held at a first voltage potential and wherein the plurality of individually-addressable sections of the patterned electrical conductor are configured to be selectively coupled to at least one second voltage potential different from the first voltage potential.

According to another aspect, the patterned electrical conductor comprises a plurality of electrically conducting layers, and wherein the plurality of individually-addressable sections includes a plurality of first conductive strips arranged in a first direction within a first layer of the plurality of electrically conducting layers and a plurality of second conductive strips arranged in a second direction within a second layer of the plurality of electrically conducting layers, wherein the second direction is perpendicular to the first direction.

According to another aspect, the at least one dielectric layer comprises at least one soft dielectric layer and at least one stiff dielectric layer having a stiffness greater than a stiffness of the at least one soft dielectric layer, wherein the compliant electrode network is arranged on a surface of the at least one soft dielectric layer, and wherein the patterned electric conductor is arranged on a surface of the at least one stiff dielectric layer.

According to another aspect, a tunable blinds structure is provided. The tunable blinds structure comprises a transparent substrate, a patterned electrical conductor arranged on a surface of the transparent substrate, wherein the patterned electrical conductor includes a plurality of individually-addressable conductive strips arranged in a vertical or horizontal direction along the transparent substrate, an elastomer structure arranged adjacent to the patterned electrical conductor, and a compliant electrode network of conducting fibers arranged on a surface of the elastomer structure, wherein the compliant electrode network is configured to compress the elastomer structure in the presence of an electric field between the compliant electrode network and one or more of the individually-addressable conductive strips to produce a voltage-dependent roughening of the surface of the elastomer structure.

According to another aspect, a method of modulating translucency of an elastomer structure including at least one elastomer layer is provided. The method comprises generating an electric field between a compliant electrode network of conducting fibers arranged on a first surface of the at least one elastomer layer and one or more of a plurality of individually-addressable sections of a patterned electric conductor arranged on a second surface of the at least one elastomer layer opposite the first surface, wherein the first surface of the at least one elastomer layer is compressed in the presence of the electric field to modulate the translucency of the elastomer structure at a location of the one or more individually-addressable sections of the patterned electric conductor by producing a voltage-dependent roughening of the first surface of the at least one elastomer layer.

According to another aspect, the method further comprises separating the individually-addressable sections of the patterned electric conductor by gaps to prevent electrical shorting between the sections.

According to another aspect, the method further comprises selectively providing a voltage to one or more of the plurality of individually-addressable sections. According to another aspect, selectively providing a voltage to one or more of the plurality of individually-addressable sections comprises selectively providing a voltage to two or more of the plurality of individually-addressable sections in sequence to provide a dynamic translucence effect.

According to another aspect, the plurality of individually-addressable sections are arranged as a series of conductive strips separated by gaps, and wherein the dynamic translucence effect mimics the opening or closing of horizontal or vertical blinds.

According to another aspect, the method further comprises wirelessly receiving control signals from a mobile electronic device and actuating the one or more of the plurality of individually-addressable sections based on the received control signals.

According to another aspect, the method further comprises holding the compliant electrode network at a first voltage potential, and selectively coupling the one or more of the plurality of individually-addressable sections of the patterned electrical conductor to at least one second voltage potential different from the first voltage potential.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

Various non-limiting embodiments of the technology will be described with reference to the following figures. It should be appreciated that the figures are not necessarily drawn to scale.

DETAILED DESCRIPTION

Dielectric elastomer actuators (DEAs) used in some conventional light modulation devices allow users to control a level of transparency of a substrate (e.g., glass) via an applied electric field or voltage. The light modulation device may include a transparent structure layered on the substrate with a transparent conductive layer (e.g., indium-tin oxide (ITO)), a transparent dielectric layer, and an elastomer layer (such as a soft transparent dielectric layer) coated with a network of conductors such as metal nanowires or carbon nanotubes. For simplicity, both metal nanowires and carbon nanotubes are referred to herein as "nanofibers." An induced electric field causes the elastomer layer of the DEA arranged between two compliant electrodes to contract in thickness and expand in surface area, and may result in a high actuation stretch with a very fast response time. As a light modulation device, the elastomer is fixed onto a substrate. When a voltage is applied, the coulombic attraction between the transparent conductive layer (which may serve as an electrode) and the network of carbon nanotubes or metal nanowires forces the nanofiber network into the soft elastomer surface which, in turn, produces a roughness in the elastomer surface that was previously smooth when no voltage was applied. The change in surface morphology results in light scattering and effectively creates a tunable window having a transparency that can be controlled by the applied voltage.

The inventors have recognized that one limitation of some conventional light modulation device designs is that transmission of light is simultaneously altered over the entire area of the device when an electric field is created across the device. The inventors have recognized and appreciated that the concept of tunable light modulation devices can be extended such that the transmission of light through select regions of the substrate can be individually addressable. Accordingly, some embodiments are directed to an integrated tunable blinds structure that includes multiple individually-addressable segments that when activated individually and/or in sequence, mimic the action of conventional pleated window blinds and shades. In some embodiments, the tunable blinds structure may be programmed such that a series of segments are actuated (e.g., converted from transparent to translucent) one segment at a time, e.g., so as to create a desired arrangement (such as a gradient) of transparency or translucency. As used herein, the term "translucence" refers to permitting light to pass through the actuated segment while diffusing the light to at least partially obscure objects viewed through the segment.

Figure 1:
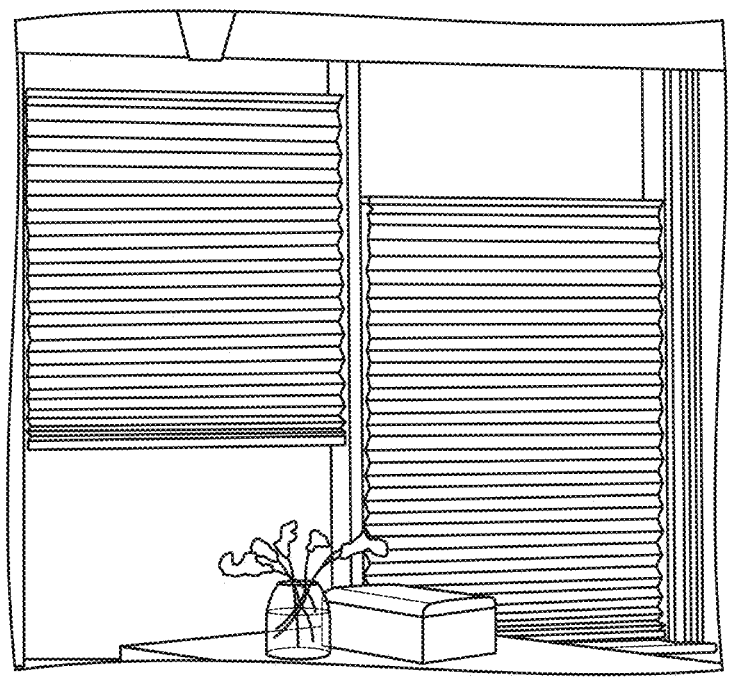
FIG. 1 illustrates pleated blinds used to dim portions of windows.
Figure 2:
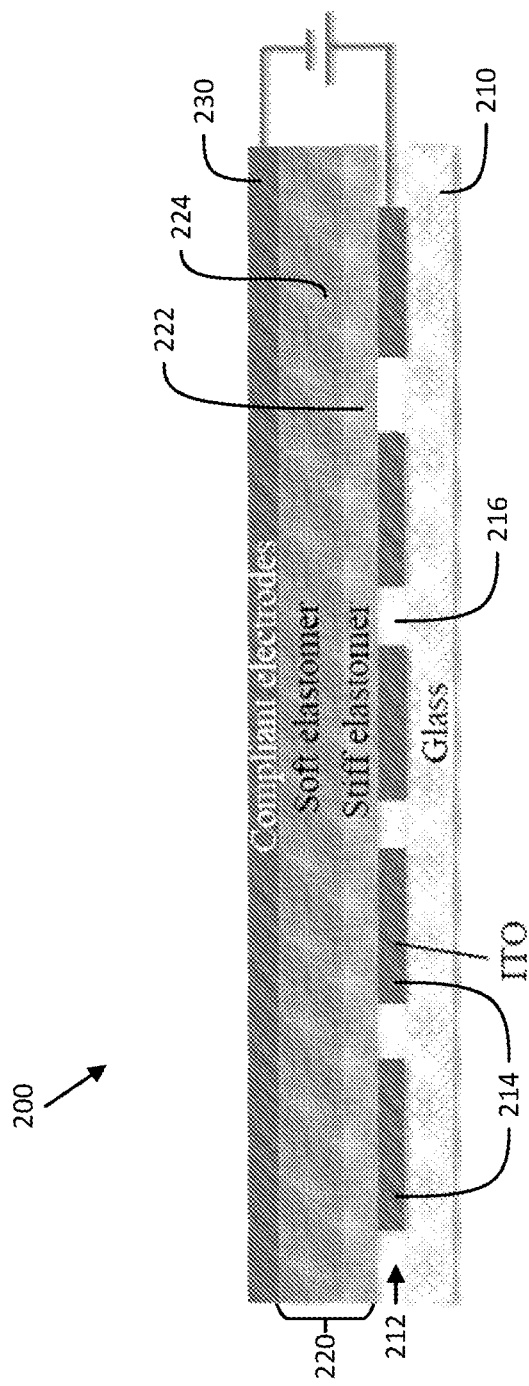
FIG. 2 shows a cross section of electrically addressable sections of a light modulation device in accordance with some embodiments.

FIG. 2 schematically illustrates a cross section of a tunable blinds structure 200 in accordance with some embodiments. The tunable blinds structure includes a transparent substrate 210 (e.g., glass) coated with an electrically conducting layer 212, such as indium-tin oxide (ITO). Alternatively, layer 212 may comprise another transparent electrically conducting ("TC") material, such as silver, fluorine-doped tin oxide (FTO), aluminum-zinc oxide (AZO), or the like. In addition, some embodiments include one or more layers (e.g., of silicon dioxide) between the TC layer 212 and the substrate 210. Additionally, or alternatively, some embodiments include one or more layers (e.g., of silicon oxynitride) directly adjacent to TC layer 212.

As shown in FIG. 2, the electrically conducting layer 212 is divided into sections 214 separated by gaps 216. Gaps 216 may be of any suitable size large enough to prevent electrical shorting between sections 214, and preferably small enough such that the gap is not apparent in reflected light. For example, in some embodiments the width of gaps is approximately 20 µm. In other embodiments the width of gaps 216 is in the range of 50-100 µm. As shown, gaps 216 may be of uniform width throughout the length of the tunable blinds structure 200 or, alternatively, at least some of the gaps 216 may have different widths.

An elastomer structure 220 comprising one or more layers of dielectric elastomer material is formed adjacent to (e.g., deposited over) the electrically conducting layer 212. As shown, elastomer structure 220 includes a stiff transparent dielectric layer 222 and a soft elastomer layer 224 having a stiffness less than the stiffness of stiff transparent dielectric layer 222. Elastomer layer 224 may comprise acrylic, PVB, silicon, EVA, urethane, or another soft material. In some embodiments, the thickness of elastomer layer 224 is on the order of 1 to 100 µm. A compliant electrode network of conducting fibers (e.g., nanofibers) 230 is arranged on the side of the elastomer structure 220 opposite the electrically conducting layer 212. In some embodiments, the compliant electrode network 230 does not extend to the edges of the elastomer structure 220.

Figure 3:
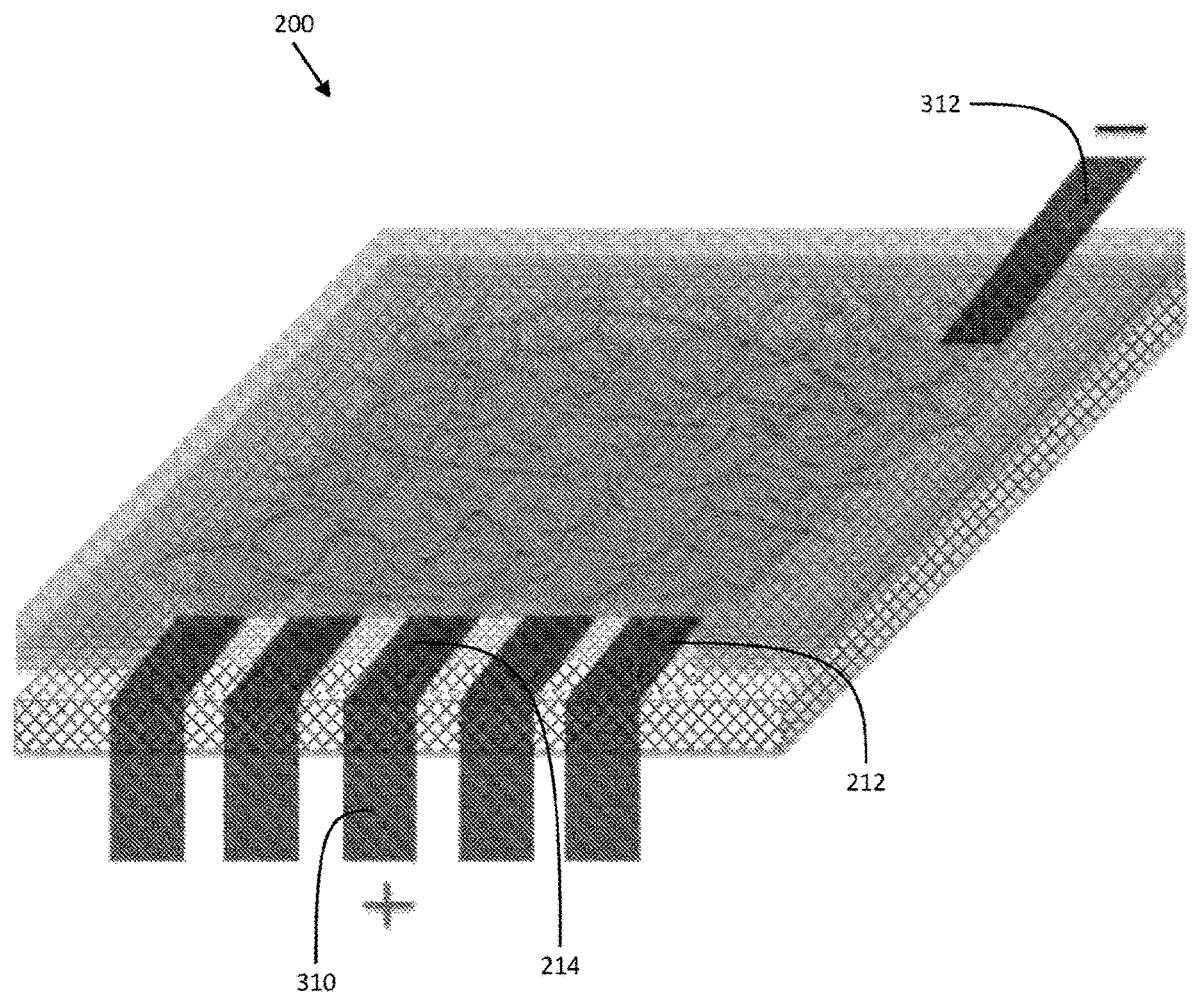
FIG. 3 shows a perspective view of the light modulation device shown in FIG. 2.

FIG. 3 shows a perspective view of the tunable blinds structure 200. In one implementation, the electrically conducting layer 212 of the tunable blinds structure 200 is created by patterning ITO-coated glass using a mask. For example, a mask having five rectangular segments separated by spacers of 50 µm was used to create the sections 214 of the illustrated electrically conducting layer 212 on the glass substrate. As shown, each of the segments is connected to a positive voltage terminal using conductive (e.g., aluminum) tape 310. Although shown as being connected to a positive voltage terminal, it should be appreciated that the each of the segments may alternatively be connected to a negative voltage terminal or electrical ground as embodiments will operate properly as long as there is a differential voltage applied between the segments of the electrically conducting layer 212 and the compliant electrode networks (via conductive strip 312).

After applying the mask, the remaining ITO was etched away using a hydrochloric acid (HCl)-based etchant. It should be appreciated that these details are not limiting. For example, other TC materials can be used instead of ITO. Also, the gaps between adjacent segments can be smaller or larger than 50 µm. Other etching techniques including, but not limited to laser scribing or ablation may also be used. Although etching is one technique for patterning the electrically conducting layer 212 on the transparent substrate, it should be appreciated that other techniques for patterning the electrically conducting layer 212 on the substrate may alternatively be used. For example, in some embodiments, patterned conductors (e.g., ITO, silver) are deposited on the transparent substrate in a particular pattern. In yet other embodiments, patterned conductors are attached to the elastomer structure 220 and the combined elastomer structure with patterned conductors is provided as a film that may be adhered to any stiff substrate (e.g., panes of glass) using, for example, glue or another suitable transparent adhesive. Accordingly, some embodiments may be retrofitted onto any transparent stiff substrate where changing the transmittance through the substrate through the use of electrically addressable blinds is desired. Such a film, designed in accordance with the techniques described herein may be applied to any stiff substrate 210 examples of which include, but are not limited to, windows, LCD screens, vehicle windshields, and solar cells.

In addition to providing tunable blinds, some embodiments may also provide thermal regulation (e.g., for smart windows). Such embodiments may be integrated with one or more sensors to adjust the transmission of radiation through the device to provide a desired amount of thermal regulation.

Although shown as being connected to a positive voltage terminal, it should be appreciated that the each of the segments may alternatively be connected to a negative voltage terminal or electrical ground as embodiments will operate properly as long as there is a differential voltage applied between the segments of the electrically conducting layer 212 and the compliant electrode networks (via conductive strip 312).

As discussed above, in some embodiments elastomer structure 220 includes a stiff transparent dielectric layer and a soft elastomer layer. These layers may be of different thicknesses and may be formed (e.g., spin coated) on the patterned TC material, e.g., ITO. One or more compliant electrode networks 230 may be formed on the elastomer structure 220 (e.g., by spraying) and the compliant electrode network(s) may be connected to the negative terminal using a conductive strip 312. Applying voltage to different segments of the tunable blinds structure 220 results in light incident on those particular segments being scattered, thereby causing a desired arrangement (e.g., a gradient) of change in transparency or translucency.

Figure 4:
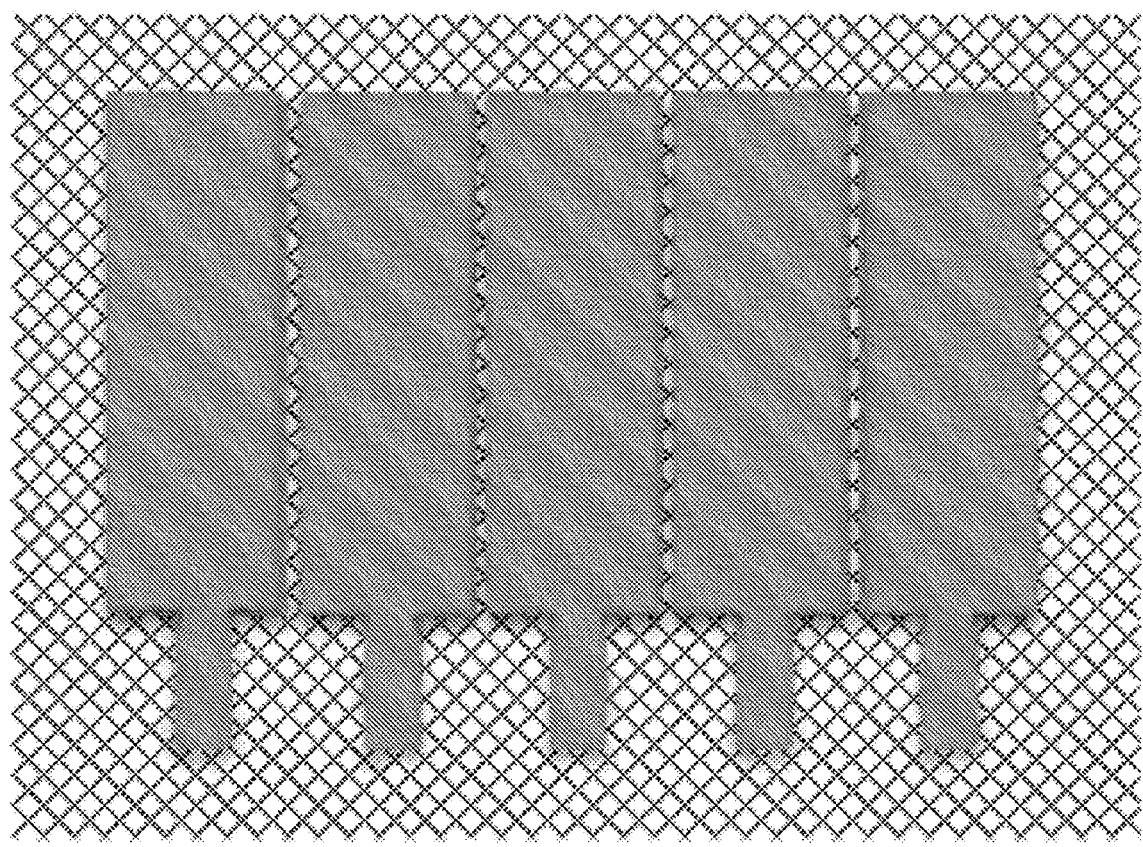
FIG. 4 shows a schematic of etched ITO on glass with individually addressable panels or slats in accordance with some embodiments.

FIG. 4 schematically shows etched TC material on glass with five panels or "slats" of TC material separated by a gap between adjacent panels. The TC material electrode panels are shown in solid, whereas the regions where the TC material has been etched away is shown using hatching. In operation, these segments are then actuated separately to control which parts of the device become translucent and which parts remain transparent, mimicking blinds. In place of an TC-material coated glass, a glass with a type of conducting metal, such as silver, could also be used provided lines can be cut or otherwise provided through the metal to make electrically separated, individually-addressable segments.

Although the tunable blinds structure 200 shown in FIGS. 2-4 includes electrically conducting layer 212 that is patterned into regions or sections to provide individually addressable portions 214, it should be appreciated that some embodiments alternatively include a continuous (i.e., not patterned) electrically conducting layer 212, and the compliant electrode network 230 is patterned into individually-addressable portions. In embodiments in which the compliant electrode network is patterned, at least some of the nanofibers may be ablated or otherwise treated to mitigate the effect of electrical discontinuities at the edges of the sections of the network.

The glass substrate in FIG. 2-4 is shown as a flat sheet of glass. In other embodiments, the substrate on which the TC material is patterned may be a non-flat (e.g., curved) substrate. In such embodiments, the TC material may be deposited on the non-flat substrate prior to patterning. In some embodiments, the substrate may be a flexible or bendable substrate (e.g., a flexible plastic) to which the electrically conducting layer (e.g., ITO or silver) is patterned. As discussed briefly above, the substrate may be any suitable transparent or semi-transparent substrate, such as glass or plastic.

Figure 5:
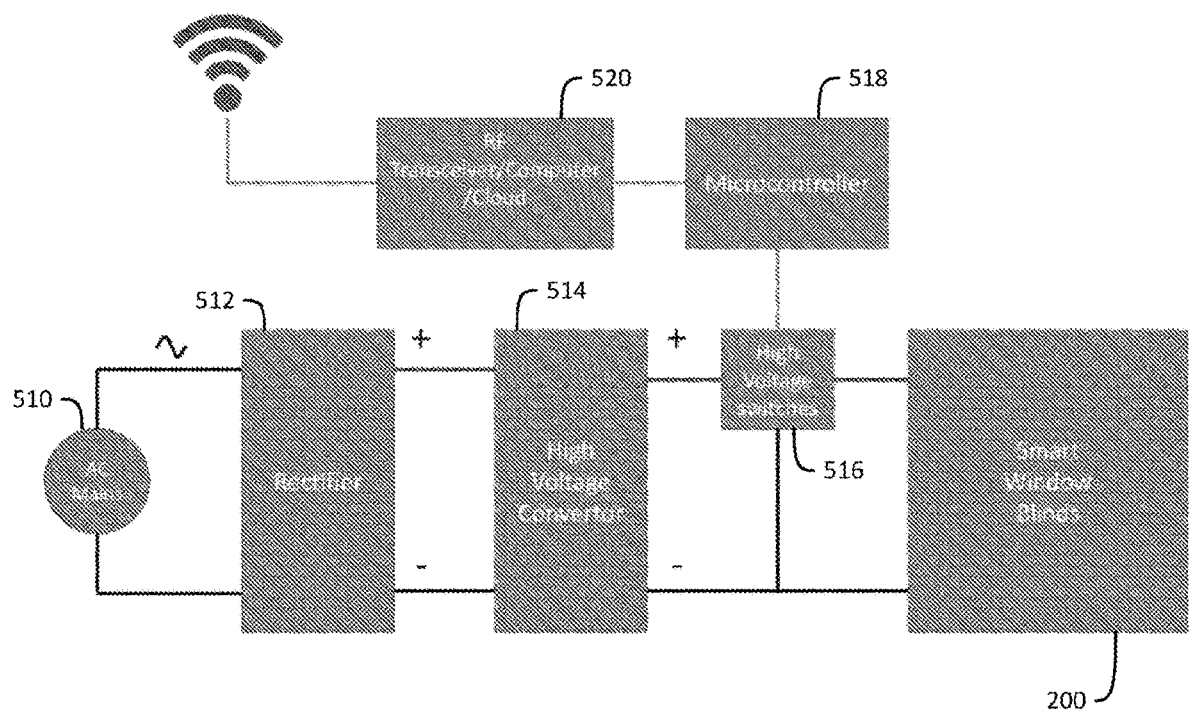
FIG. 5 is a block diagram of an electrical control circuit used to control a light modulation device designed in accordance with some embodiments.

FIG. 5 shows a block diagram representing an electronic control circuit that may be used in some embodiments to control operation of a tunable blinds structure 200. As shown, an AC voltage (e.g., from a standard wall outlet) rectified by rectifier 512 is converted by high voltage converter 510. The high voltage can be distributed to one or more individually addressable sections using high voltage switches 516. In some embodiments, high voltage switches 516 may be implemented using high voltage transistors or relays and may be operated with low voltage signals to control the actuation of the tunable blinds structure 200. The low voltage signals may be generated from any suitable power source including, but not limited to, a computer or a smartphone.

The blinds can be electronically activated using high voltage solid state switches to control the actuation of individual segments using TTL-level input signals. These signals can be generated using a microcontroller 518, which connect to an RF transceiver device 520 for programmable control of the tunable blinds structure 200 over Bluetooth or WiFi. Individual segments of the electrically conducting layer 212 can then be connected to ground through another high voltage switch, to discharge the segments when they return to being transparent. In some embodiments, one or more of the individually addressable sections in electrically conducting layer 212 may be actuated by the electronic control circuit to apply a voltage to one section, multiple sections simultaneously, or one or more sections in a temporal sequence (e.g., one after another) to achieve an effect similar to conventional blinds on a window.

A temporal sequence of activation of particular sections of the electrically conducting layer 212 provides for a dynamic translucence effect in which the user perceives a rolling blinds effect where the blinds are opening or closing at a controlled rate. The interplay between which sections are turned on or off and the sequence of turning the sections on or off provides the desired dynamic effect.

In some embodiments, two or more of the sections of electrically conducting layer 212 may be actuated using different voltages to provide different amounts of translucency for the sections to which the different voltages are applied. For example, using different actuation voltages applied to different sections could enable the device to have a graded translucency.

The electrical control circuit may be programmed to control the actuation of the voltages applied to the compliant network electrode 230 and the electrically conducting layer 212 in any suitable way for the particular desired application. In some embodiments, the compliant network electrode 230 is held at a constant voltage potential (e.g., ground) and the voltage(s) applied to the sections of the electrically conducting layer 212 are varied in amplitude and/or temporal sequence. In other embodiments, the electronic control circuit may be used to vary the voltage of the compliant network electrode 230, while holding constant one or more of the voltages applied to the one or more sections of the electrically conducting layer 210.

Figure 6:
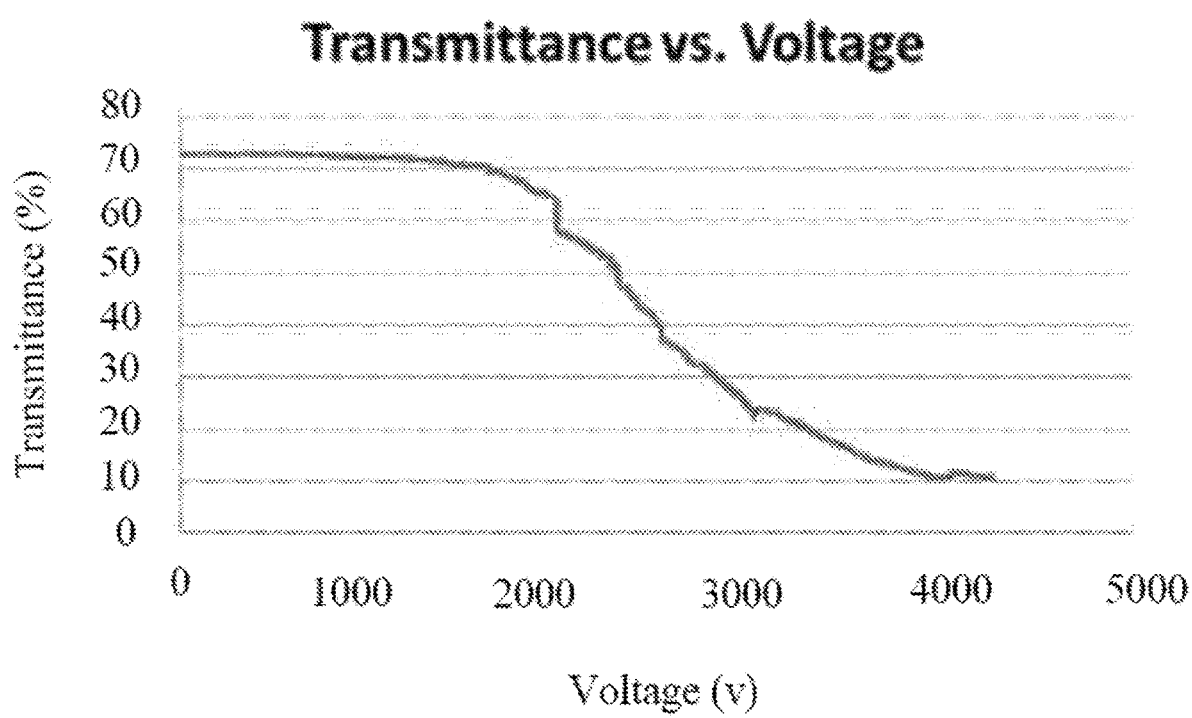
FIG. 6 is a plot of transmittance versus applied voltage as measured for a tunable blinds device designed in accordance with some embodiments.

FIG. 6 shows a plot of optical white light transmittance versus applied voltage for a tunable blinds structure designed in accordance with some embodiments. As shown, when no voltage is applied to the structure, the regular visible transmission is approximately 75%. When a voltage of 4 kV is applied, the regular visible transmission of the exemplary structure decreases to approximately 10%. Thus, in some embodiments, the device when in the transparent state has a regular visible transmission of at least about 65%, such as greater than 70%, or even greater than 72%, whereas the device when in the translucent state has a regular visible transmission of about 20% or less, such as less than 15%, or even less than about 10%.

The term "visible transmission" as used herein refers to the percentage of all incident visible radiation that is transmitted through the device. The term "regular visible transmission" as used herein refers to the percentage of all incident visible radiation that is transmitted directly through the device without diffusion or the like. Visible radiation constitutes the wavelength range of between about 380 nm and about 780 nm. Visible transmittance, as well as visible reflectance, can be determined in accordance with NFRC 300-2014, Standard Test Method for Determining the Solar and Infrared Optical Properties of Glazing Materials and Fading Resistance of Systems. As an example, the well-known WINDOW 7.1 computer program can be used in calculating these and other reported optical properties.

Figure 7:
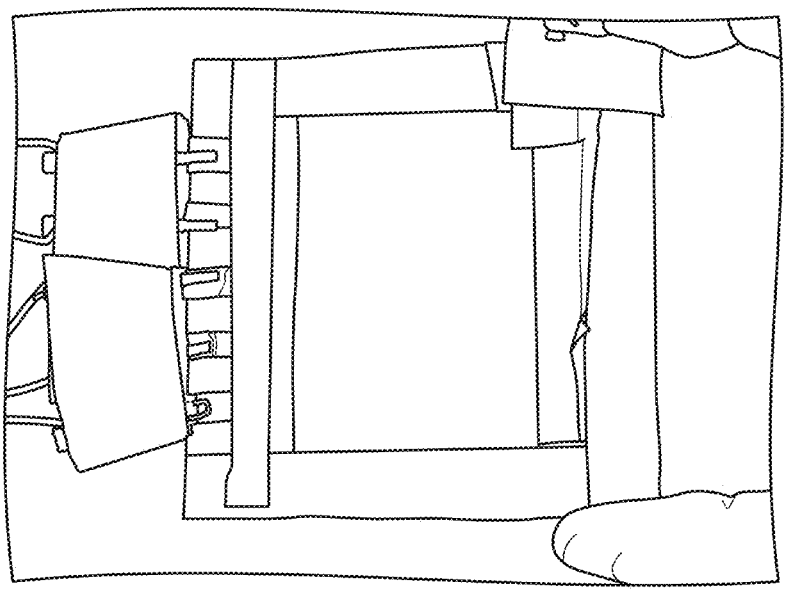
FIG. 7 is a photograph of a tunable blinds device designed in accordance with some embodiments.

FIG. 7 shows each TC segment of a tunable blinds structure being connected to a positive voltage terminal, whereas the compliant electrodes are connected through aluminum foil to a ground terminal. Alternatively, the ITO segments may be connected to a negative voltage terminal or a ground terminal with the compliant electrodes being connected to a positive voltage terminal.

Figure 8:
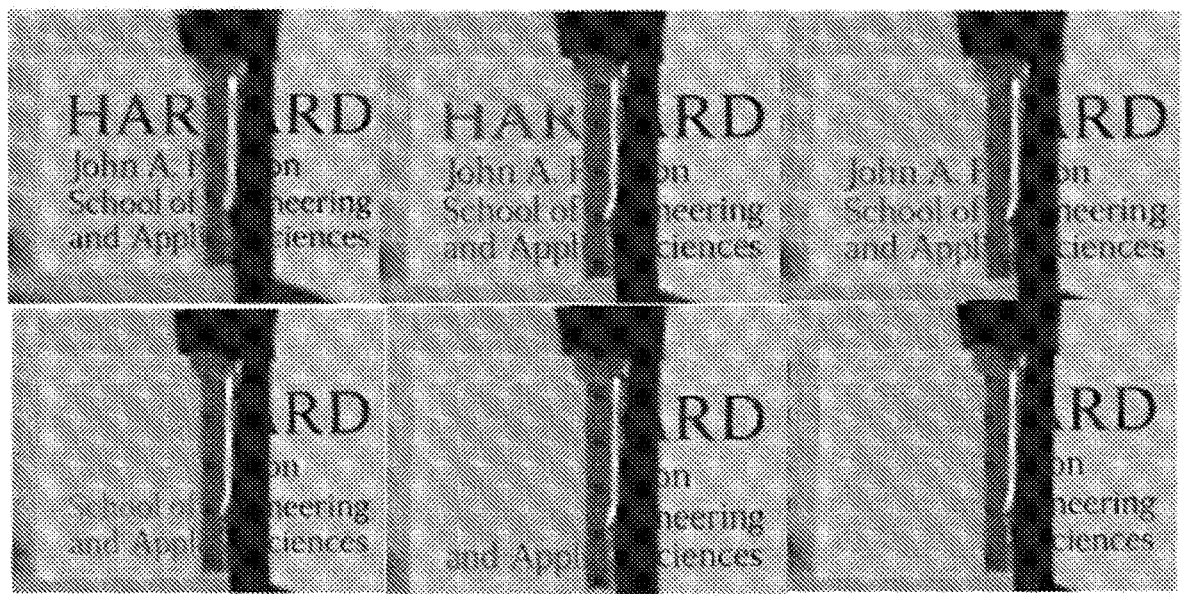
FIG. 8 shows a sequence of images as individual sections of the tunable blinds device are activated to provide a dynamic blinds effect.

FIG. 8 shows a sequence of images as individual segments of a tunable blinds structure designed in accordance with some embodiments are activated to mimic a downward motion of a pleated blind.

The patterned electrically conducting layer 212 described above is configured to form strips of conductive material that can be individually addressed to create a blinds effect for changing the transmission properties of light incident on the device. Alternatively, the electrically conducting layer 212 may be patterned in other ways to provide different effects. For example, in some embodiments the electrically conducting layer 212 may include multiple conductive layers, one layer of which is patterned to include slats along a horizontal direction, and another layer of which is patterned to include slats along a vertical direction to create a grid of overlapping conductive material. By addressing a particular combination of horizontal and vertical slats, activated "pixels" at the intersection between the addressed slats may provide a local change in translucency at that location.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The invention claimed is:

1. A tunable light modulation device, comprising:
   an elastomer structure including at least one elastomer layer;
   a compliant electrode network of conducting fibers arranged on a first surface of the at least one elastomer layer, wherein the compliant electrode network is configured to be held at a first voltage potential; and
   a patterned electric conductor arranged on a second surface of the at least one elastomer layer opposite the first surface,
   wherein the patterned electric conductor includes a plurality of individually-addressable sections configured to be selectively coupled to at least one second voltage potential different from the first voltage potential, and
   wherein the compliant electrode network is configured to compress the first surface of the at least one elastomer layer in a presence of an electric field between the compliant electrode network and one or more of the plurality of individually-addressable sections of the patterned electric conductor to produce a voltage-dependent roughening of the first surface of the at least one elastomer layer.

2. The tunable light modulation device of claim 1, wherein the plurality of individually-addressable sections are separated by gaps to prevent electrical shorting between the plurality of individually-addressable sections.

3. The tunable light modulation device of claim 1, further comprising a transparent substrate arranged adjacent to the patterned electric conductor.

4. The tunable light modulation device of claim 3, wherein the transparent substrate is curved and/or flexible.

5. The tunable light modulation device of claim 1, further comprising a controller configured to selectively provide a voltage to one or more of the plurality of individually-addressable sections and/or wirelessly receive control signals from a mobile electronic device.

6. The tunable light modulation device of claim 5, wherein the controller is configured to selectively provide a voltage to the plurality of individually-addressable sections in sequence to provide a dynamic translucence effect.

7. The tunable light modulation device of claim 6, wherein the plurality of individually-addressable sections are arranged as a series of conductive strips separated by gaps, and wherein the dynamic translucence effect mimics an opening or closing of horizontal or vertical blinds.

8. The tunable light modulation device of claim 1, further comprising a plurality of conductive interconnects, each of which is arranged to couple one of the plurality of individually-addressable sections to a voltage source.

9. The tunable light modulation device of claim 1, wherein the compliant electrode network of conducting fibers comprises a plurality of nanowires or a plurality of carbon nanotubes.

10. The tunable light modulation device of claim 1, wherein the patterned electric conductor comprises a plurality of electrically conducting layers, and wherein the plurality of individually-addressable sections includes a plurality of first conductive strips arranged in a first direction within a first layer of the plurality of electrically conducting layers and a plurality of second conductive strips arranged in a second direction within a second layer of the plurality of electrically conducting layers, wherein the second direction is perpendicular to the first direction.

11. The tunable light modulation device of claim 1, wherein the at least one elastomer layer comprises at least one soft elastomer layer and at least one stiff dielectric layer having a stiffness greater than a stiffness of the at least one soft elastomer layer,
wherein the compliant electrode network is arranged on a surface of the at least one soft elastomer layer, and
wherein the patterned electric conductor is arranged on a surface of the at least one stiff dielectric layer.

12. A tunable blinds structure, comprising:
a transparent substrate;
a patterned electric conductor arranged on a surface of the transparent substrate, wherein the patterned electric conductor includes a plurality of individually-addressable conductive strips arranged in a vertical or horizontal direction along the transparent substrate,
an elastomer structure arranged adjacent to the patterned electric conductor; and
a compliant electrode network of conducting fibers arranged on a surface of the elastomer structure, wherein the compliant electrode network is configured to compress the elastomer structure in a presence of an electric field between the compliant electrode network and one or more of the plurality of individually-addressable conductive strips to produce a voltage-dependent roughening of the surface of the elastomer structure, wherein the compliant electrode network is configured to be held at a first voltage potential, and wherein the plurality of individually-addressable conductive strips are configured to be selectively coupled to at least one second voltage potential different from the first voltage potential.

13. The tunable blinds structure of claim 12, further comprising a controller configured to selectively provide a voltage to one or more of the plurality of individually-addressable conductive strips and/or wirelessly receive control signals from a mobile electronic device.

14. The tunable blinds structure of claim 13, wherein the controller is configured to selectively provide a voltage to the plurality of individually-addressable conductive strips in sequence to provide a dynamic translucence effect to mimic an opening or closing of blinds on the transparent substrate.

15. The tunable blinds structure of claim 12, wherein the elastomer structure includes at least one soft elastomer layer upon which the compliant electrode network is arranged and at least one stiff dielectric layer having a stiffness greater than a stiffness of the at least one soft elastomer layer.

16. A method of modulating translucency of an elastomer structure including at least one elastomer layer, the method comprising:
generating an electric field between a compliant electrode network of conducting fibers arranged on a first surface of the at least one elastomer layer and one or more of a plurality of individually-addressable sections of a patterned electric conductor arranged on a second surface of the at least one elastomer layer opposite the first surface, the generating comprising:
holding the compliant electrode network at a first voltage potential; and
selectively coupling the one or more of the plurality of individually-addressable sections of the patterned electric conductor to at least one second voltage potential different from the first voltage potential,
wherein the first surface of the at least one elastomer layer is compressed in a presence of the electric field to modulate the translucency of the elastomer structure at a location of the one or more of the plurality of individually-addressable sections of the patterned electric conductor by producing a voltage-dependent roughening of the first surface of the at least one elastomer layer.

17. The method of claim 16, further comprising selectively providing a voltage to two or more of the plurality of individually-addressable sections in sequence to provide a dynamic translucence effect.

18. The method of claim 16, further comprising wirelessly receiving control signals from a mobile electronic device and actuating the one or more of the plurality of individually-addressable sections based on the received control signals.

* * * * *